Aug. 4, 1959 R. F. RUTZ 2,898,474
SEMICONDUCTOR DEVICE ENCAPSULATION
Filed Sept. 4, 1956
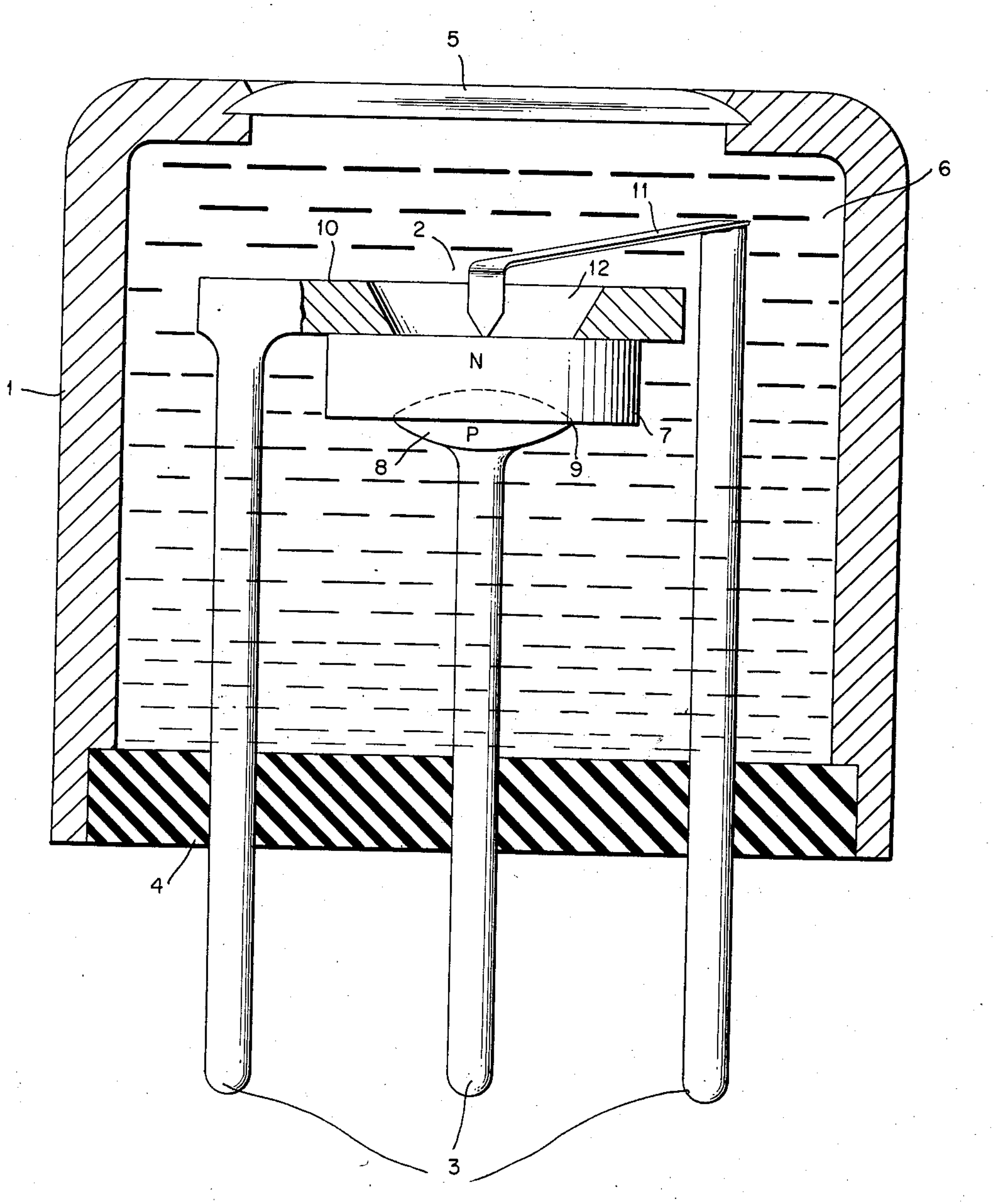
*INVENTOR.*
RICHARD F. RUTZ
*BY*
Alvin J. Riddles
AGENT United States Patent Office 2,898,474

Patented Aug. 4, 1959

2,898,474

SEMICONDUCTOR DEVICE ENCAPSULATION

Richard F. Rutz, Fishkill, N.Y., assignor to International Business Machines Corporation, New York, N.Y., a corporation of New York Application September 4, 1956, Serial No. 607,782

4 Claims. (Cl. 250—211)

This invention relates to semiconductor devices such as diodes and transistors and in particular to the environment used in encapsulating such devices.

The performance, and consequently the limitations on the use of semiconductor devices such as transistors, diodes and photocells, is in many cases sharply restricted by the behavior of the particular semiconductor device when subjected to variations in temperature. As a typical example of the effect of temperature variations on such devices, the reverse current through a rectifying contact of a transistor or diode made of germanium has been known to increase by ten times its original value with a ten degree centigrade increase in temperature. This sharp sensitivity to temperature variation is most difficult to control when the temperature change is due to power dissipated within the device itself such as would occur as the result of current flow through the device. Under these circumstances, if direct attachment to a large mass such as a heat sink is employed, in many circuit applications the resulting capacity would have detrimental effects on the circuit.

It has been discovered that a semiconductor device encapsulated in an environment of mesitylene is capable of dissipating more internal heat, has less associated capacity, has lower surface recombination of carriers and at the same time can be illuminated with light.

Accordingly, a primary object of this invention is to provide a semiconductor device capable of high current carrying capacity.

Another object of this invention is to provide a semiconductor device structure having a low associated capacitance.

Still another object of this invention is to provide a semiconductor device encapsulated in a translucent environment.

Other objects of the invention will be pointed out in the following description and claims and illustrated in the accompanying drawings, which disclose, by way of example, the principle of the invention and the best mode, which has been contemplated, of applying that principle.

In the drawings, the single figure is a semiconductor device package illustrating this invention.

Referring now to the figure, a semiconductor device package is illustrated wherein a housing 1 is provided surrounding a semiconductor device such as a transistor 2, the terminals 3 of which extend through a seal 4 such as an insulating plastic which forms an hermetic seal with the terminals 3 and with the housing 1. A light transmitting insert 5, such as a glass disc, is provided to permit the introduction of light into the housing 1 for photosensitive semiconductor applications. The housing 1 is filled with mesitylene 6, which surrounds the semiconductor device.

In order to illustrate the many interrelated advantages gained through the use of an hermetically sealed container filled with mesitylene as the encapsulating environment for a semiconductor device, a particular transistor will be considered, it being understood that many of the advantages described will be equally applicable to other types of semiconductor devices. The transistor 2, illustrated in the figure, is of the type described in copending application No. 458,619 filed September 27, 1954, and assigned to the assignee of this application. The transistor 2, comprises a semiconductor crystal wafer 7, arbitrarily shown as N type material having a region of opposite conductivity 8, and forming a junction barrier 9 which serves as the emitter of the transistor. An ohmic connection 10 is made to the crystal 7, and serves as the base electrode. A current amplifying type collector, illustrated as an electroformed point contact 11, of the type described in U.S. Patent 2,825,857, makes current amplifying contact with the crystal 7 through an aperture 12 in the ohmic base connection 10.

The material mesitylene is known chemically as 1, 3, 5 trimethylbenzene $C_6H_3(CH_3)_3$. It is a nontoxic colorless liquid having a boiling point of 160° C. and a dielectric constant of 2.353. The mesitylene 6 substantially fills the housing covering at least the crystal 7 and the larger contacts such as the base 10, and thus, being a liquid, it comes in physical contact with the entire surface of the crystal 7 and the electrodes attached to it. When heat is formed in the crystal 7 due to the passage of current, the heat is transferred by radiation from the crystal 7 to the mesitylene 6 and by conduction and subsequent radiation from all electrodes to the mesitylene. It should be noted here that through the use of this environment all of the surface area of every electrode attached to the crystal 7 is available as a radiating surface for transfer of heat. As the heat is radiated to the mesitylene 6, this material, through both convection and conduction, transfers the heat to the housing 1. In the event that the heat transferred is sufficient to raise the temperature of the mesitylene to the boiling point change of state cooling takes place wherein the mesitylene changes state to a vapor at the heat source, namely the crystal 7, and condenses back to a liquid at the housing 1. Since the heat of vaporization of the material is absorbed in this type of cooling, it is highly efficient.

The physical properties of mesitylene are such that its viscosity is low and essentially constant over a wide range of temperatures and its thermal conductivity is high, thus insuring efficient conduction and convection heat transfer under all normal conditions of use.

Some further physical properties of considerable advantage in connection with semiconductor devices are the fact that mesitylene is an essentially clear and therefore translucent liquid and it is nonmiscible with water.

In the figure, a translucent insert 5 is shown in the housing 1, to admit light. The light generates hole-electron pairs of carriers in the semiconductor crystal 7 and the presence of these carriers influence the back resistance of a rectifying contact such as the junction 9 or point 11, giving thereby, a change in current flow, in an external circuit not shown, associated with the electrode whose back resistance is affected. Through the use of the mesitylene 6, the light is transmitted to the crystal through the medium that also serves as a coolant so that there is no loss in radiating area in order to expose the surface of the device to light.

It is established in the art that recombination of carriers on the surface of the crystal 7 and surface leakage currents in the vicinity of the junction 9 and point 11, are detrimental to the performance of a semiconductor device. The effect of these items has been found to be reduced by control of the amount of moisture present on the surface of the semiconductor crystal. The mesitylene being nonmiscible with water, prevents moisture in the container from contacting the crystal 7, and further serves to transport any water vapor already present on the crystal 7, to the cooler housing 1 when the crystal becomes heated.

The inherent capacitance of a circuit element is determined by the ability of the element to store energy in the immediate enviroment of it and its associated terminals and the amount of energy stored is directly related to the dielectric constant of the immediate environment. The material mesitylene has a low dielectric constant and as a result, the inherent capacitance of a semiconductor device encapsulated in this material is very small. This permits much higher frequency response from the particular device encapsulated.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A semiconductor circuit element comprising a thermally conductive container, a monocrystalline semiconductor device within said container and a quantity of mesitylene surrounding said semiconductor device and substantially filling said container.

2. A solid state circuit element comprising a quantity of monocrystalline semiconductor material, electrode means associated with said semiconductor material, a thermally conductive container surrounding said semiconductor material and said electrode means and a quantity of mesitylene substantially filling said container and surrounding said semiconductor and said electrode means.

3. A light sensitive semiconductor device comprising a monocrystalline semiconductor body, electrode means associated with said body, a container surrounding said body and said electrode means, means for introducing light into said container and a quantity of mesitylene surrounding said semiconductor body and said electrode means and substantially filling said container.

4. A temperature stable semiconductor circuit element comprising an external sealed container, a semiconductor device having a monocrystalline semiconductor body with signal electrodes attached thereto within said container, terminal means connecting said signal electrodes within said container to points external to said container and a quantity of mesitylene within said container and surrounding said semiconductor device.

References Cited in the file of this patent

UNITED STATES PATENTS

| | | |
|---|---|---|
| 2,288,341 | Addink | June 30, 1942 |
| 2,640,901 | Kinman | June 2, 1953 |
| 2,810,870 | Hunter et al. | Oct. 22, 1957 |
| 2,825,857 | Salecker | Mar. 4, 1958 |